(12) United States Patent
Thornton et al.

(10) Patent No.: US 7,589,007 B2
(45) Date of Patent: Sep. 15, 2009

(54) MESFETS INTEGRATED WITH MOSFETS ON COMMON SUBSTRATE AND METHODS OF FORMING THE SAME

(75) Inventors: Trevor J. Thornton, Fountain Hills, AZ (US); Michael E. Wood, San Diego, CA (US)

(73) Assignee: Arizona Board of Regents for and on Behalf of Arizona State University, Scottsdale, AZ (US)

( * ) Notice: Subject to any disclaimer, the term of this patent is extended or adjusted under 35 U.S.C. 154(b) by 26 days.

(21) Appl. No.: 11/112,061

(22) Filed: Apr. 22, 2005

(65) Prior Publication Data

US 2005/0184343 A1 Aug. 25, 2005

Related U.S. Application Data

(63) Continuation-in-part of application No. 10/895,490, filed on Jul. 20, 2004, now Pat. No. 6,987,292, which is a continuation of application No. 10/391,402, filed on Mar. 17, 2003, now Pat. No. 6,864,131, which is a continuation-in-part of application No. 10/018,439, filed as application No. PCT/US00/15066 on May 31, 2000, now Pat. No. 6,630,382.

(60) Provisional application No. 60/564,868, filed on Apr. 22, 2004, provisional application No. 60/137,077, filed on Jun. 2, 1999, provisional application No. 60/364,258, filed on Mar. 15, 2002.

(51) Int. Cl.
H01L 21/44 (2006.01)

(52) U.S. Cl. .................. 438/597; 438/655; 438/664

(58) Field of Classification Search .................. 438/157
See application file for complete search history.

(56) References Cited

U.S. PATENT DOCUMENTS 3,896,483 A 7/1975 Whelan
4,177,390 A 12/1979 Cappon (Continued)

FOREIGN PATENT DOCUMENTS

EP 0184827 A2 6/1986

(Continued)

OTHER PUBLICATIONS

Chen et al., "Dependence of Current Match on Back-Gate Bias in Weakly Inverted MOS Transistors and its Modeling", IEEE Journal of Solid-State Circuits, 31(2):259-262, 1996.

(Continued)

Primary Examiner—Steven Loke
Assistant Examiner—David Goodwin
(74) Attorney, Agent, or Firm—Withrow & Terranova, P.L.L.C.

(57) ABSTRACT

An integrated circuit has first and second complementary MOSFETs and first and second complementary MESFETs fabricated on a common substrate. An insulating layer is disposed on the common substrate. The active region uses salicide block oxide layers to align the drain and source regions to the gate. Alternatively, the active region uses polysilicon separators surrounded by side wall oxide spacers to align the drain and source regions to the gate. The MESFET may have a drift region between the gate terminal and drain region for high voltage applications. A "T"-shaped metal contact to the gate of the MESFETs reduces the gate length of the device

7 Claims, 14 Drawing Sheets

U.S. PATENT DOCUMENTS

| | | | |
|---|---|---|---|
| 4,277,883 A * | 7/1981 | Kaplan | 438/149 |
| 4,422,087 A * | 12/1983 | Ronen | 257/282 |
| 4,568,957 A | 2/1986 | Zuleeg et al. | |
| 4,603,469 A | 8/1986 | Armiento et al. | |
| 4,677,736 A * | 7/1987 | Brown | 438/296 |
| 4,700,461 A | 10/1987 | Choi et al. | |
| 4,732,870 A | 3/1988 | Mimura | |
| 4,768,076 A | 8/1988 | Aoki et al. | |
| 4,783,688 A | 11/1988 | Shannon | |
| 4,788,156 A | 11/1988 | Stoneham et al. | |
| 4,810,907 A | 3/1989 | Tohyama | |
| 4,830,980 A | 5/1989 | Hsieh | |
| 4,962,413 A | 10/1990 | Yamazaki et al. | |
| 5,002,897 A | 3/1991 | Lewis et al. | |
| 5,031,007 A | 7/1991 | Chaffin et al. | |
| 5,111,256 A | 5/1992 | Ohata et al. | |
| 5,116,774 A | 5/1992 | Huang et al. | |
| 5,148,244 A | 9/1992 | Iwasuki | |
| 5,166,553 A | 11/1992 | Kotera et al. | |
| 5,214,298 A | 5/1993 | Yuan et al. | |
| 5,286,985 A * | 2/1994 | Taddiken | 257/200 |
| 5,302,840 A | 4/1994 | Takikawa | |
| 5,357,119 A | 10/1994 | Wang et al. | |
| 5,374,862 A | 12/1994 | Takano | |
| 5,422,563 A | 6/1995 | Pflueger | |
| 5,493,141 A | 2/1996 | Ricco et al. | |
| 5,510,280 A * | 4/1996 | Noda | 438/179 |
| 5,663,584 A | 9/1997 | Welch | |
| 5,734,180 A * | 3/1998 | Malhi | 257/77 |
| 5,883,402 A * | 3/1999 | Omura et al. | 257/146 |
| 5,900,662 A * | 5/1999 | Frisina et al. | 257/341 |
| 6,025,211 A * | 2/2000 | Ishikura et al. | 438/105 |
| 6,046,475 A * | 4/2000 | Chang et al. | 257/345 |
| 6,166,404 A | 12/2000 | Imoto et al. | |
| 6,222,210 B1 | 4/2001 | Cerny et al. | |
| 6,306,691 B1 | 10/2001 | Koh | |
| 6,351,018 B1 * | 2/2002 | Sapp | 257/499 |
| 6,362,057 B1 * | 3/2002 | Taylor et al. | 438/286 |
| 6,440,832 B1 * | 8/2002 | Krivokapic | 438/597 |
| 6,475,891 B2 * | 11/2002 | Moon | 438/584 |
| 6,503,782 B2 | 1/2003 | Casady et al. | |
| 6,507,239 B2 | 1/2003 | Ochi | |
| 2002/0020878 A1 * | 2/2002 | Kawanaka | 257/351 |
| 2002/0070412 A1 * | 6/2002 | Mitlehner et al. | 257/401 |
| 2004/0043548 A1 * | 3/2004 | Redd | 438/185 |
| 2008/0186772 A1 * | 8/2008 | Horch | 365/185.18 |

FOREIGN PATENT DOCUMENTS

| | | |
|---|---|---|
| EP | 0268386 A2 | 5/1988 |
| JP | 04290474 A | 10/1992 |
| JP | 06236998 A | 8/1994 |

OTHER PUBLICATIONS

Green et al., "A Simple Two-Dimensional Model for Substhreshold Channel-Length Modulation in Short-Channel MOSFETs", IEEE Transactions on Electron Devices, 40(8):1560-1563, 1993.

Liang et al., "A Diffusion Model of Substhreshold Current for GaAs Mesfets", Solid-State Electronics, 34(2):131-138, 1991.

MacWilliams, K., "Device Physics and Technology of Complementary Silicon MESFETs for VLSI Applications", IEEE Transactions on Electron Devices, 38(12):2619-2631, 1991.

Mead et al., "Fine Points of Transistor Physics", Analog VLSI and Neural Systems, Appendix B, pp. 319-323, 1989.

Thornton, T., "Schottky Junction Transistor-Micropower Circuits at GHz Frequencies", IEEE Electron Devices, 22(1):38-40, 2001.

Thornton, T., "Physics and Applications of the Schottky Junction Transistor", IEEE Transactions on Electron Devices, 48(10):2421-2427, 2001.

* cited by examiner

MESFETS INTEGRATED WITH MOSFETS ON COMMON SUBSTRATE AND METHODS OF FORMING THE SAME

CLAIM TO DOMESTIC PRIORITY

The present non-provisional patent application is a continuation-in-part of U.S. patent application Ser. No. 10/895,490 filed Jul. 20, 2004 now U.S. Pat. No. 6,987,292, which is a continuation of U.S. patent application Ser. No. 10/391,402, filed Mar. 17, 2003 now U.S. Pat. No. 6,864,131, which is a continuation-in-part of Ser. No. 10/018,439, filed Nov. 30, 2001 now U.S. Pat. No. 6,630,382, which is the National Stage of International Application PCT/US00/15066 filed on May 31, 2000, which claims priority of U.S. Provisional Patent Application Ser. No. 60/137,077 filed on Jun. 2, 1999, and said U.S. application Ser. No. 10/391,402, filed Mar. 17, 2003 claims benefit of Provisional Application Ser. No. 60/364,258, filed Mar. 15, 2002. The present non-provisional patent application further claims priority to Provisional Application Ser. No. 60/564,868 entitled "CMOS Compatible Sub-threshold Silicon MESFETS and Methods of Forming the Same", filed on Apr. 22, 2004.

FIELD OF THE INVENTION

The present invention relates in general to semiconductor devices and, more particularly, to MESFETs integrated with MOSFETs on a common substrate.

BACKGROUND OF THE INVENTION

Electronic devices such as diodes, transistors and the like are commonly used in many items found in homes, offices, vehicles, personal electronics, communications, computers, industrial and aerospace applications, medical devices and elsewhere. Generally speaking, a transistor is a three-terminal device that provides signal routing, amplification, and switching capabilities in analog and digital circuits. Recently, efforts have been focused upon creating transistors that perform various functions with reduced power consumption. The ability to reduce power consumption is particularly desirable in battery powered applications, such as cell phones, laptops, portable audio and video equipment, digital watches, pocket calculators, wireless pagers, and medical implants including pacemakers, artificial cochlea, and the like. Low-power applications are typically implemented using ultra-large-scale-integration (ULSI) circuits, which frequently require low power devices to minimize total power dissipation.

Micropower circuits based on sub-threshold transistor operation are widely used in the aforementioned low-power applications. The majority of these micropower circuits have been fabricated using standard CMOS processing. The micropower operation is achieved by ensuring that most of the MOSFETs are biased in the sub-threshold regime, commonly known as weak-inversion. The drain current flowing in a weakly inverted MOSFET is typically in the range $10^{-10}$ to $10^{-5}$ amps per micron of channel width. The low current, combined with the low drain voltage required to achieve current saturation ($V_d^{sat} > 3kT/e \sim 75$ mV) is one reason for the low power consumed by micropower CMOS circuits. Since the cut-off frequency of a weakly inverted MOSFET is very low, micropower CMOS circuits typically operate at frequencies less than 10 MHz.

SUMMARY OF THE INVENTION

In one embodiment, the present invention is a method of forming an integrated circuit, comprising providing a substrate, forming a first MOSFET device on the substrate, and forming a first MESFET device on the substrate.

In another embodiment, the present invention is a method of forming MESFET and MOSFET devices on a common substrate, comprising forming a first MOSFET device on the common substrate, forming a second MOSFET device on the common substrate, the second MOSFET being of opposite conductivity type as the first MOSFET, forming a first MESFET device on the common substrate, and forming a second MESFET device on the common substrate, the second MESFET being of opposite conductivity type as the first MESFET.

In another embodiment, the present invention is a method of forming MESFET and MOSFET devices on a common substrate, comprising forming an insulating layer on the common substrate, forming a first MOSFET over the insulating layer, and forming a first MESFET over the insulating layer. The first MESFET has an active region and first and second salicide block oxide layers disposed over the active region. The first salicide block oxide layer is formed across a first area to become a boundary between a source region and a gate terminal of the first MESFET and the second salicide block oxide layer is formed across a second area to become a boundary between a drain region and the gate terminal of the first MESFET.

In another embodiment, the present invention is a semiconductor device, comprising a common substrate. A first MOSFET device is disposed on the common substrate. A second MOSFET device is disposed on the common substrate. The second MOSFET is of opposite conductivity type as the first MOSFET. A first MESFET device is disposed on the common substrate. A second MESFET device is disposed on the common substrate. The second MESFET is of opposite conductivity type as the first MESFET.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

A description of Schottky Junction Transistors (SJT), a form of MESFET, is provided in U.S. Pat. No. 6,630,382, entitled "Current Controlled Field Effect Transistor", and U.S. Pat. No. 6,864,131, entitled "Complementary Schottky Junction Transistors and Methods of Forming the Same", which are incorporated herein by reference.

Figure 1:
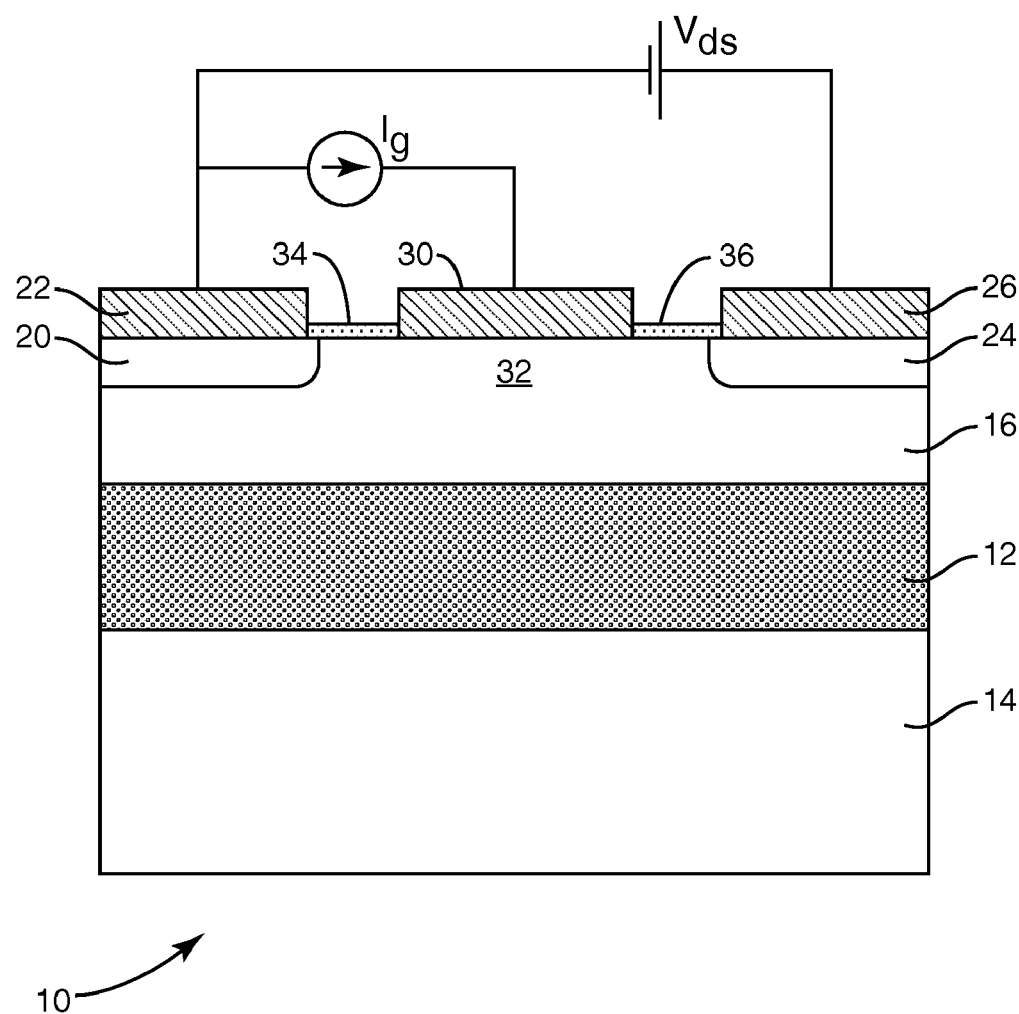
FIG. 1 is a cross-sectional view of a MESFET.

A cross-section through a MESFET device 10 is shown in FIG. 1. The device shown in FIG. 1 could be designed to operate as a MESFET, or as a Schottky Junction Transistor. MESFET 10 has an optional insulating layer 12 disposed on silicon substrate 14 using silicon-on-insulator (SOI) technology. In other embodiments, MESFET 10 can be fabricated with any other technology such as silicon, gallium arsenide (GaAs), gallium nitride, poly-crystalline silicon, amorphous silicon, silicon dioxide (glass), silicon-on-sapphire (SOS), and the like. An active region 16 is disposed on insulating layer 12, or on substrate 14 for embodiments without insulating layer 12. Source region 20 is formed in active region 16, and source terminal 22 is formed on source region 20. Drain region 24 is also formed in active region 16, and drain terminal 26 is formed on drain region 24. Gate terminal 30 is formed on channel region 32 of active region 16. Oxide region 34 provides electrical isolation between the source and gate, while oxide region 36 provides electrical isolation between the drain and gate.

In SOI fabrication, insulating layer 12 can be deposited, sputtered, or otherwise formed on substrate 14 as buried silicon dioxide, silicon nitride, or any other suitable insulating material, to a thickness in the range 0.05 to 0.5 microns. Other techniques such as wafer bonding, for example, are capable of producing buried oxides thicker than 10 microns or more.

Active region 16 can be sputtered, deposited, grown, or otherwise formed on insulating layer 12 to a thickness in the range 0.01 to 0.2 microns. In active region 16, n-type semiconductor material is used for the n-channel devices, and p-type semiconductor material is used for the p-channel devices. Alternatively, region may be formed with GaAs, GaN, poly-crystalline silicon, and amorphous silicon. In one embodiment, active region 16 is formed to a thickness of 0.05 µm that has been doped n-type to a concentration $N_{Doping}$ of about $10^{17}$ cm$^{-3}$.

Gate terminal 30 is formed with cobalt di-silicide (CoSi$_2$), aluminum, platinum or any other material that forms a Schottky junction when deposited on channel region 32. The gate length ranges from about 0.01 microns to about 5 microns or more. Source terminal 22 and drain terminal 26 are formed using aluminum, copper, gold, silver, silicide, or any other conducting material that forms a low resistance, ohmic contact to channel region 32. To aid the formation of low resistance ohmic contacts, region 20 under the source contact and region 24 under the drain contact can be heavily doped with arsenic or phosphorus for n-channel MESFETs, and boron for p-channel MESFETs.

When biased into the sub-threshold regime the MESFET 10 can be operated as an SJT as follows. When the Schottky gate terminal 30 is forward biased, an input gate current flows that is exponentially dependent on the gate to source voltage ($V_{GS}$). The channel doping and thickness are chosen such that the drain current flowing from the drain contact to the source contact is in the sub-threshold mode or regime and also varies exponentially with $V_{GS}$. The sub-threshold drain current is controlled using the input gate current by a substantially constant current gain, $\beta = I_d/I_g$, where $I_d$ is the drain current flowing in the channel and $I_g$ is the input gate current. An analytical derivation of the current gain gives the following result.

$$\beta = \frac{I_d}{I_g} = \frac{\varepsilon k^2 \mu}{aL_g^2 q^2 A^*} \frac{N_c}{N_{Doping}} \exp\left(\frac{qN_{Doping}a^2}{2\varepsilon U_T}\right) \quad (1)$$

where:
  $\epsilon$ is permittivity
  k is Boltzmann's constant
  µ is electron mobility for n-channel device (hole mobility for p-channel)
  $N_c$ is effective density of states in conduction band (valence band)
  q is electronic charge
  $N_{doping}$ is donor concentration (acceptor concentration) in channel
  a is channel thickness (same for both n-channel and p-channel devices)
  $L_g$ is gate length
  A* is Richardson's constant From equation (1) it can be seen that the SJT current gain is substantially independent of the voltage bias applied, and depends on fundamental constants and device structure properties. By carefully selecting channel doping, channel thickness, and gate length, a current gain greater than unity ($\beta > 1$) can be achieved for devices manufactured in accordance to the methods described herein. In addition, equation (1) shows that the current gain of an SJT is independent of threshold voltage $V_{th}$. Accordingly, transistor matching of sub-threshold SJTs should be superior to that of sub-threshold MOSFETs of the same gate length. As well as superior transistor matching, other advantages of the SJT device compared to a sub-threshold MOSFET include higher carrier mobility (electron or hole) and reduced gate capacitance, both of which lead to higher transistor cut-off frequencies. The higher cut-off frequency allows SJT-based micropower circuits to operate at higher frequencies that an equivalent CMOS-based circuit.

By suitable control of the channel doping and thickness of channel 16, the MESFET device 10 shown in FIG. 1 can also be operated above threshold as a depletion mode MESFET. In depletion mode, larger currents can flow than when the device is biased into sub-threshold. The drain current is described by the "square-law" given in equation (2) below.

$$I_d = k(V_{gs} - V_t)^2 \quad (2)$$

In equation (2) $V_t$ is a threshold voltage which would be less than zero for an n-channel depletion mode MESFET. The parameter k is a constant that depends upon the channel width, gate length, and carrier mobility. Operating a MESFET above threshold is important when a large signal current has to be driven into a load for moderate to high power operation. If high power operation is required the ability to drive a MESFET with high drain voltages is also important.

From a circuit point of view, it is frequently advantageous to use complementary devices to reduce power consumption and to improve design flexibility. In one embodiment, a complementary pair of devices may have an n-channel transistor connected to a p-channel transistor. The n-channel and p-channel devices are said to be "complementary" if equal and opposite biases applied to the inputs of the transistors produce equal and opposite output currents. The basic complementary pair of devices can be used to realize virtually any digital or analog circuit in an efficient manner. In a CMOS circuit, for example, each current path through the circuit typically passes through both n-type and p-type transistors, with only one type of transistor being turned on in any stable state so there is typically little or no static power dissipation. Current flows only to charge an undesirable parasitic capacitance when a gate switches.

FETs are typically made complementary by making the channel width of the p-type device approximately two times larger than that of the n-channel device to compensate for the greater mobility of electron carriers, which is generally true for MOSFETs and MESFETs operating above or below threshold. The increased size of the p-type device frequently creates disadvantages in terms of size and cost. Moreover, the increased capacitance of the p-channel device often results in increased power consumption as well as reduced switching speed. By exploiting the capabilities of the SJT, however, it is possible to fabricate complementary n-channel and p-channel SJT devices that have approximately equal gate widths and gate lengths. Some advantages resulting from the use of complementary SJTs compared to conventional complementary silicon devices may include, in various embodiments, smaller circuit area, and therefore reduced cost, for a given function; higher operating speeds for given drain currents; and superior transistor matching for short gate length devices.

The SJT may be appropriately designed and operated as a current-controlled current-source when operated below threshold ($V_{gs} < V_{th}$). In such embodiments, the main device parameter is the current gain $\beta$. To obtain complementary SJT behavior the current gains of the n-channel and p-channel devices need to be the same. With reference again to equation (1) above, it can be shown that the current gain of an SJT device depends upon the channel geometry and doping. Many of the parameters in equation (1) are fixed either because they are physical constants (e, k, $N_c$, q and $U_T$), or because the parameters are fixed by the semiconductor fabrication process. Channel thickness is typically designed to be approximately the same for both n-channel and p-channel devices to simplify the fabrication process. Channel length is also typically designed to be as small as possible and to be approximately the same for both n-channel and p-channel devices. Accordingly, the remaining variables in equation (1) are the carrier mobility and channel doping. Electron mobility is known to be approximately twice as large as the hole mobility.

For most semiconductor devices, including MOSFETs and MESFETs, the most practical way to achieve complementary devices is to make the gate width of the p-channel device approximately twice as large as the gate width of the n-channel device to compensate for the different carrier mobilities. With the SJT approach of controlling drain current with a gate current, however, substantially the same current gains can be obtained for both types of devices by changing the channel doping in such a way that it compensates for the lower hole mobility, resulting in substantially equal current gain values for both n-channel and p-channel devices without varying the relative size of the devices. By controlling the channel doping ion implantation step, complementary devices with substantially the same gate widths and lengths can be realized. Because of the resulting space reduction and the reduced capacitance that results from the smaller p-channel device, the complementary SJT-based circuits occupy less wafer area and operate at higher frequencies than other devices.

An additional advantage of various embodiments of the SJT is that circuits made using complementary versions of the device take up less area than prior art MOSFET circuits. The reduction in area occurs for two reasons. First, the device does not typically require an insulator between gate and channel, so the gate length of both n-channel and p-channel devices can be made smaller than those in conventional MOSFETS. Secondly, the complementary n-channel and p-channel SJTs may be made with conducting channels of the same or similar width. In conventional CMOS circuits, p-channel devices may be approximately twice as wide as n-channel devices. Digital circuits made from complementary version of the new device may therefore be able to achieve higher integration levels than conventional CMOS because of (i) the reduction in width of the p-channel device and (ii) the ability to scale the gate length to smaller dimensions. Other advantages associated with the lack of a gate insulator in the current invention are (i) reduced input (gate) capacitance and (ii) reduced manufacturing complexity.

Figure 2:
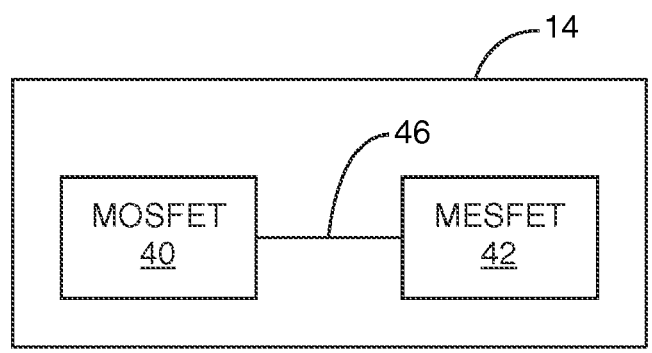
FIG. 2 illustrates MOSFETs and MESFETs integrated on a common substrate.

As a feature of the present invention, MESFETs are fabricated on a common substrate with MOSFETs. The MESFETs can be implemented as complementary SJTs (CSJTs) devices for sub-threshold operation or as conventional depletion mode MESFETs for above threshold operation. The MOSFETs can be implemented as CMOS devices. FIG. 2 illustrates one or more MOSFET (or CMOS) devices 40 formed on the same substrate 14 as one or more MESFETs (or CSJT) devices 42. The MOSFET devices 40 may provide electrical circuit functions independent of the MESFET devices 42, or MOSFET devices 40 may be electrically connected to the MESFET devices 42 by conductor 46 to provide an electrical circuit function using both types of devices. The composite integrated circuit provides the advantages of both complementary MOSFETs (CMOS) and of complementary MESFETs. The complementary MOSFET devices and complementary MESFET devices each perform electrical circuit functions in accordance with the advantages and strengths of each device. An SOI CMOS process flow can be used to fabricate the MESFETs by exploiting the self-aligned silicide (salicide) process as described below.

An enhancement mode sub-threshold MESFET can be fabricated so as to operate as a SJT whereby channel drain current is controlled by the application of a bias current into, or out of, the gate electrode of the SJT. Again, by carefully selecting channel doping, channel thickness, and gate length, a current gain greater than unity can be achieved for devices manufactured in accordance to the methods described below. In various embodiments, both input gate current and output drain current of the SJT may be made to vary exponentially with the applied gate bias by selecting appropriate layer thickness and doping concentrations, making the ratio of drain current to gate current, e.g., the current gain, $\beta$, of the device substantially constant. Additionally, the methods described below allow complementary n-channel and p-channel CSJTs to be manufactured on the same substrate as complementary n-channel and p-channel MOSFETs. The integration of CSJTs and CMOS transistors is achieved using CMOS processing steps and exploits the self-aligned silicide (salicide) process to form the Schottky gate of the CSJTs.

A depletion mode MESFET can be designed for operation above threshold operation. In the above threshold regime drain currents in the range $10^{-4}$ to $10^{-3}$ A/µm or more are typical. Now the saturated drain current varies as the square of the gate voltage as described by equation (2) above. Complementary behavior can be achieved for MESFETs operating above threshold. The methods described below are equally applicable to the manufacture of complementary MESFETs operating above threshold and integrated with CMOS devices on a common substrate.

The following description demonstrates the manufacturing steps required to integrate complementary MESFETs with CMOS devices on a common silicon substrate or SOI substrate. Alternative substrates such as bulk silicon can be used with straightforward modifications to the process flow can also be used. The individual n-channel and p-channel MOSFETs and n-channel and p-channel MESFETs are formed in active regions that are electrically isolated from each other using semiconductor processing techniques such as local oxidation of silicon mesa etching or shallow trench etching followed by local oxidation of silicon (LOCOS).

Figure 3A:
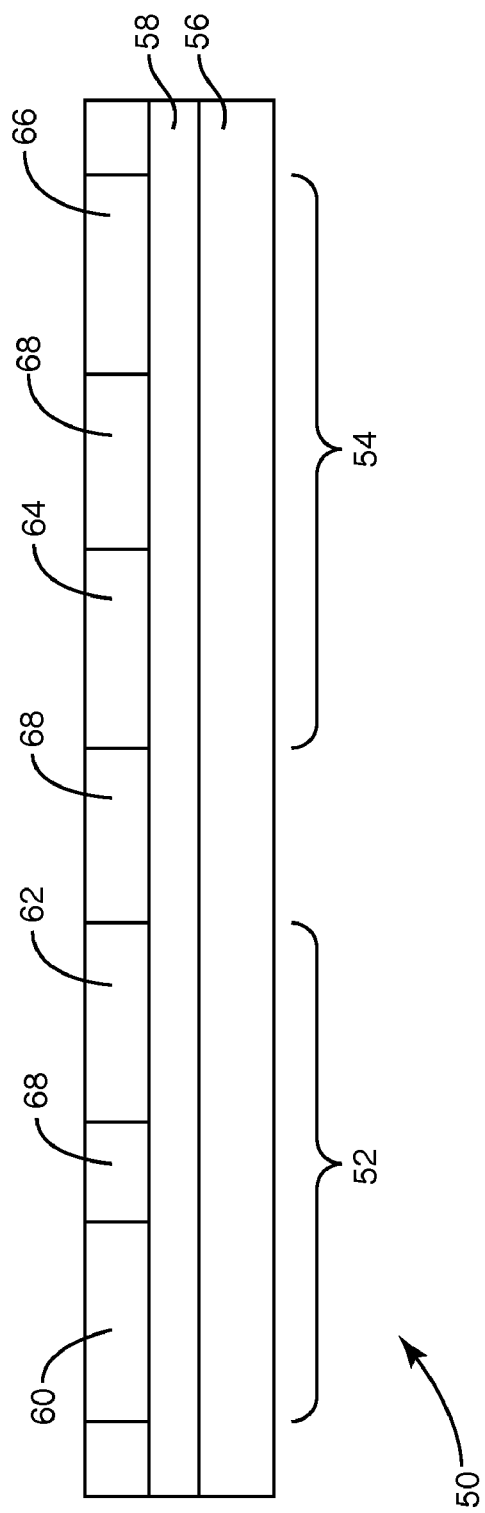
FIGS. 3a-3n illustrate cross-sectional and top views of forming MOSFETs and MESFETs on a common substrate.

FIG. 3a is a cross-sectional view of an early processing state through an integrated circuit 50 containing MOSFETs and MESFETs fabricated on a common substrate. In general, the MOSFETs are formed in area 52 and the MESFETs are formed in area 54. For the purpose of illustration, one p-channel MOSFET and one n-channel MOSFET are formed in area 52, and one p-channel MESFET and one n-channel MESFET are formed in area 54. The following discussion is readily extendable to many more MOSFET and MESFET devices integrated on the common substrate of integrated circuit 50.

A buried oxide layer 58 is formed on silicon substrate 56. N-well region 60 and p-well region 62 are formed on buried oxide layer 58 and represent the active areas for the p-channel MOSFET and n-channel MOSFET devices, respectively. P-well region 64 and n-well region 66 are formed on buried oxide layer 58 and represent the active areas for the p-channel and n-channel MESFET devices, respectively. The active regions 60-66 are separated by oxide isolation regions 68. The active region isolation can also be achieved using mesa etching, ion beam induced damage, LOCOS, shallow trench isolation, or other suitable techniques.

Figure 3B:
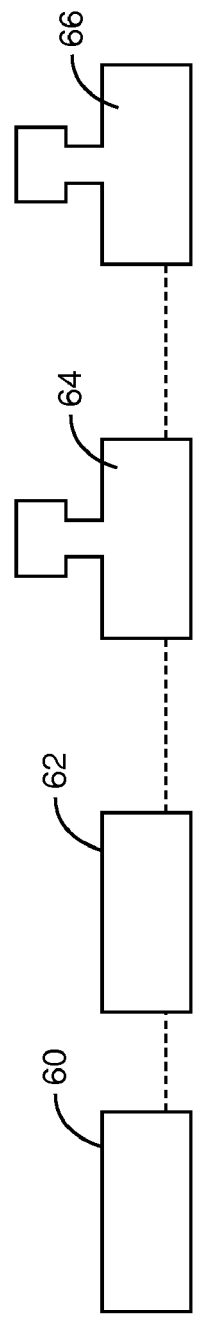

FIG. 3b is a top surface view showing the active n-well region 60 and p-well region 62 for the p-channel and n-channel MOSFET devices, respectively, and the active p-well region 64 and n-well region 66 for the p-channel and n-channel MESFET devices, respectively. P-well region 64 and n-well region 66 have a "T" extension which is used to make contact with the MESFET Schottky gate while maintaining reduced device geometries as described in detail below.

The formation of the n-well and p-well regions of the MOSFET and MESFET devices may involve up to four separate ion implantation steps, i.e., one implantation for each of n-well active region 60 of the p-channel MOSFET, p-well active region 62 of the n-channel MOSFET, p-well active region 64 of the p-channel MESFET, and n-well active region 66 of the n-channel MESFET. Alternatively, the devices can be formed using two implantation steps: one implantation for n-well active regions 60 and 66 of the p-channel MOSFET and n-channel MESFET, and another implantation for p-well active regions 62 and 64 of the n-channel MOSFET and p-channel MESFET.

Figure 3C:
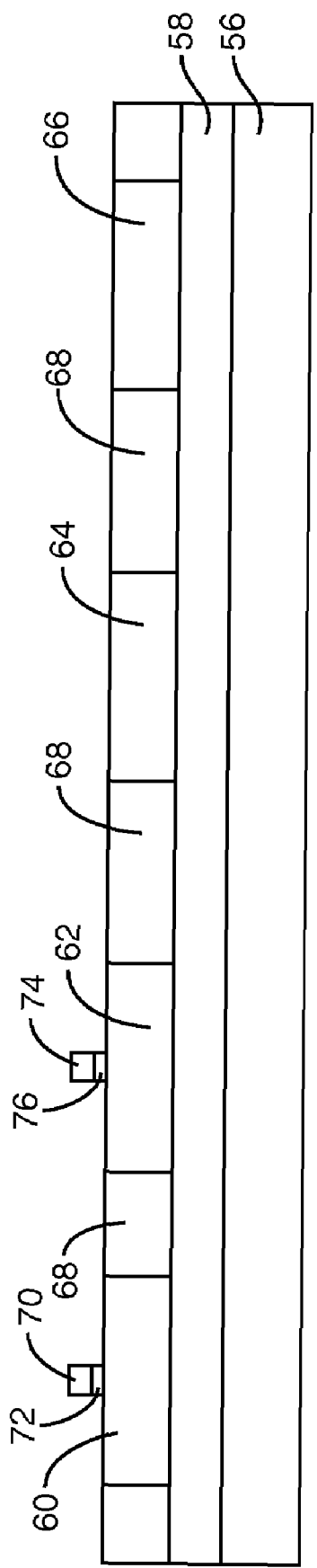
Figure 3D:
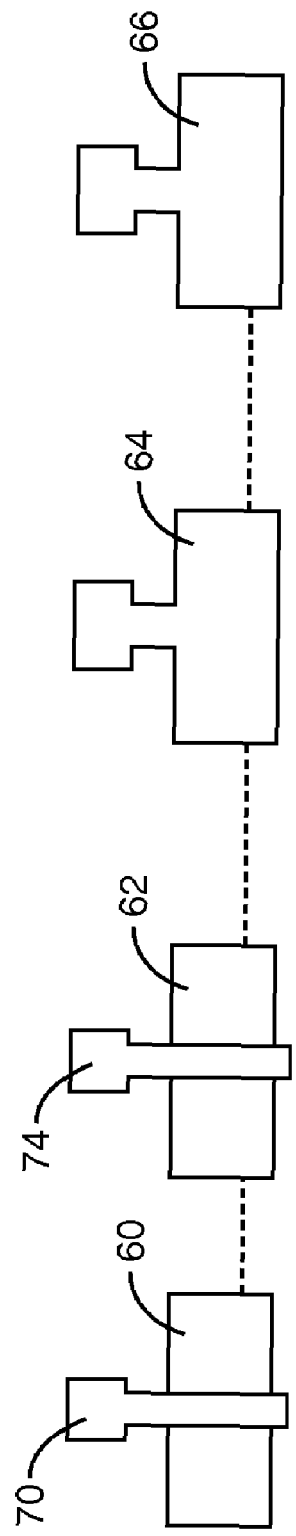

After formation of the n-well and p-well active regions, the poly-silicon gates for the p-channel MOSFET and n-channel MOSFET are formed as shown in the cross-sectional view of FIG. 3c. A poly-silicon gate 70 is formed over gate oxide layer 72 above n-well region 60 of the p-channel MOSFET. A poly-silicon gate 74 is formed over gate oxide layer 76 above p-well region 62 of the n-channel MOSFET. In one embodiment, the gate oxide is grown on all exposed active regions, including those used for the MESFETs. The entire wafer is covered with poly-silicon by chemical vapor deposition (CVD). The gate oxide and poly-silicon is removed by reactive ion etching from all surfaces except above the active regions of the p-channel MOSFET and n-channel MOSFET. No gate oxide and poly-silicon remains above the MESFET active regions at the end of the CVD processing step as shown in the top view of FIG. 3d. The poly-silicon gates 70 and 74 also have "T" extension as shown for contacting the gate terminal of the MOSFETs, while reducing device geometry.

Figure 3E:
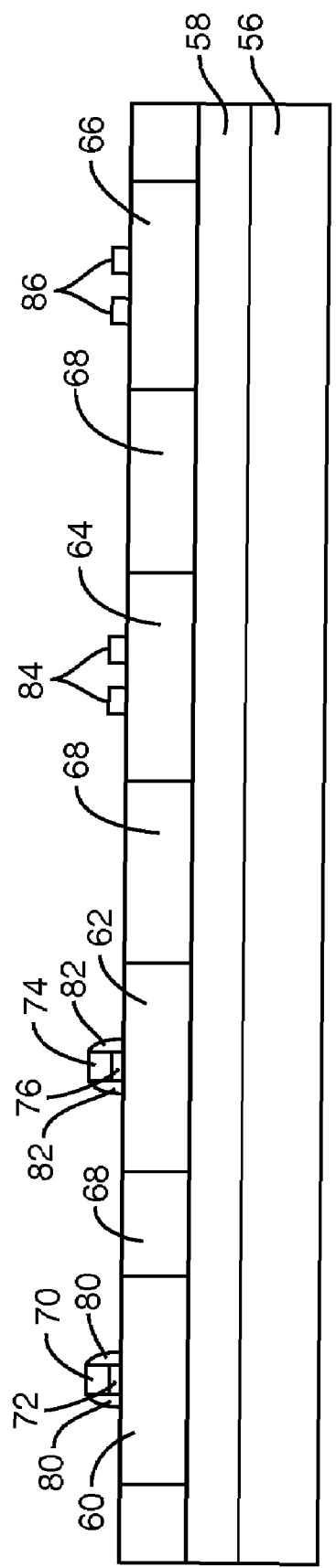

The integration of MOSFETs and MESFETs on a common substrate involves the use of a patterned chemical vapor deposited oxide layer that allows silicide to be formed above the relatively lightly doped p-well region 64 and n-well region 66 of the MESFET devices. The silicide is used in a salicide manner to produce a low resistance contact above heavily doped source, drain, and poly-silicon gate regions. In the cross-sectional view of FIG. 3e, the patterning of the oxide layer uses a silicide-block process to separate the ohmic contact silicide formed on the highly doped source and drain contacts from the Schottky gate silicide formed on the relatively lightly doped p-well region 64 of the p-channel MESFET and n-well region 66 of the n-channel MESFET.

Figure 3F:
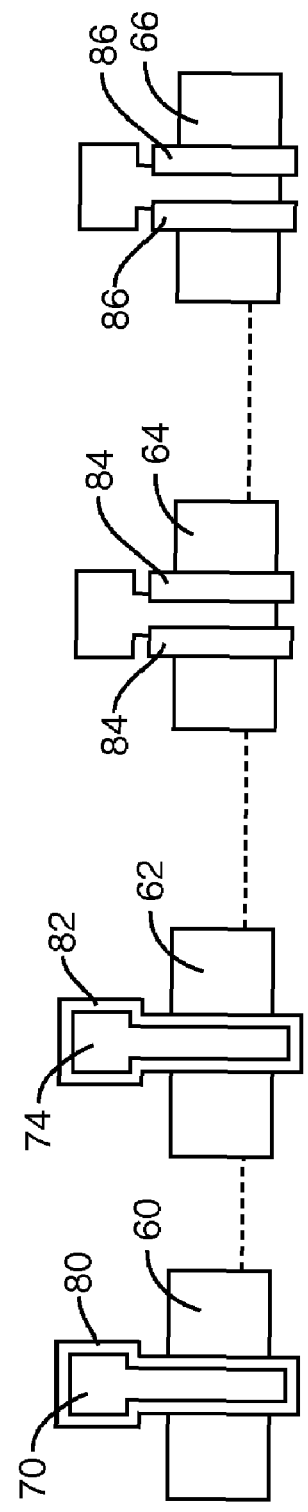

An oxide layer is deposited over the entire wafer using CVD. The thickness of the oxide layer is typically 0.1 to 0.2 micron. A photoresist layer is then spun on the surface and baked prior to photolithographic patterning. After photolithographic patterning and development, the photoresist is then used as an etch mask in a subsequent etch step that removes all CVD oxide except for that under the photoresist and that at the edges of the MOS gate structure. Oxide spacers 80 and 82 are thus formed around the poly-silicon gates 70 and 74 of the MOSFET devices. After the oxide etch and removal of the remaining photoresist, salicide block oxide layers 84 and 86 remain above the n-well region 64 and p-well region 66, as well as the oxide spacers 80 and 82 around the poly-silicon gate structure of the MOSFET devices. The salicide block oxide layers 84 and 86 are respectively aligned above the active regions 64 and 66 across the boundaries between the source and channel regions and the drain and channel regions of each MESFET device. The top view of FIG. 3f shows further detail of the oxide spacers 80 and 82 around the poly-silicon gate structures of the MOSFET devices, and salicide block oxide layers 84 and 86 over the active regions of the MESFET devices.

Figure 3G:
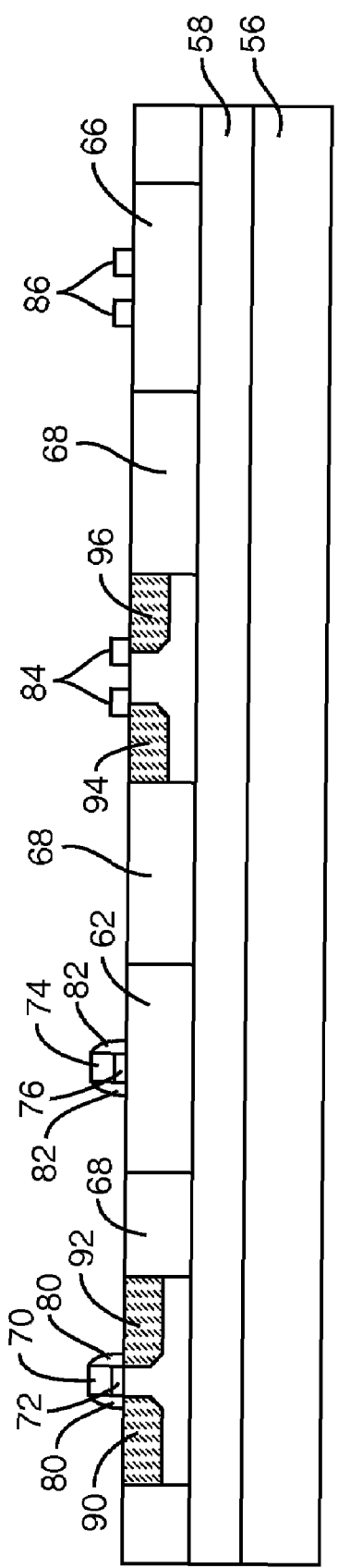
Figure 3H:
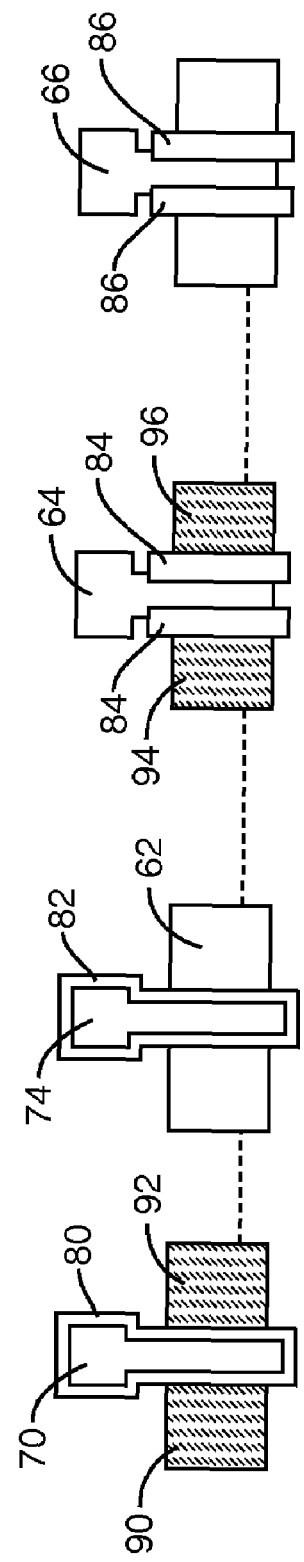

The p-type source region 90 and p-type drain region 92 for the p-channel MOSFET device, and the p-type source region 94 and p-type drain region 96 for the p-channel MESFET device, are formed as shown in the cross-sectional view of FIG. 3g. The p-type source and drain regions 90-96 for the MOSFET and MESFET devices are heavily doped in a single implant step. The implant may be boron at an energy of about 50 keV to a dose of about $10^{15}$ per $cm^2$. FIG. 3h shows a top view of the source and drain regions 90-96 for the p-channel MOSFET and p-channel MESFET devices.

Figure 3I:
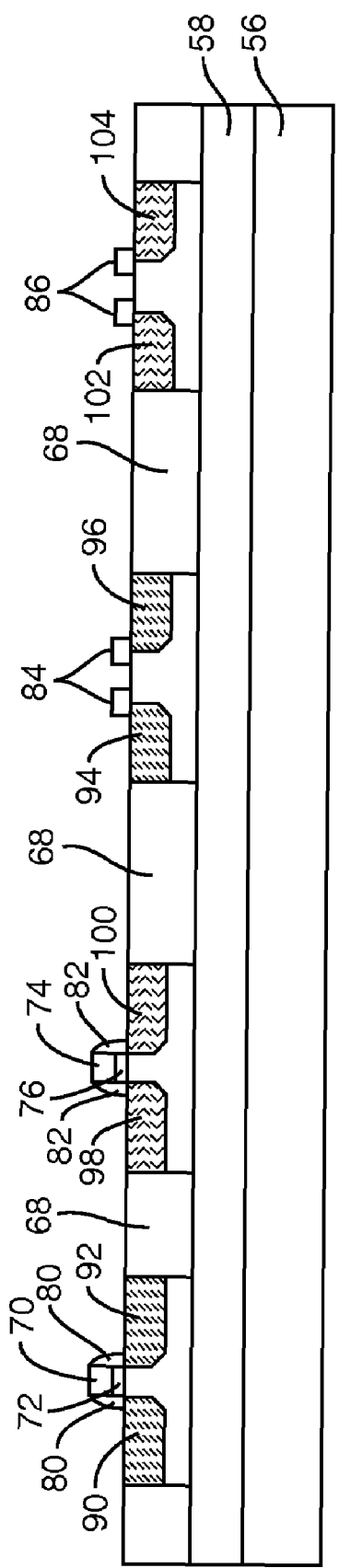
Figure 3J:
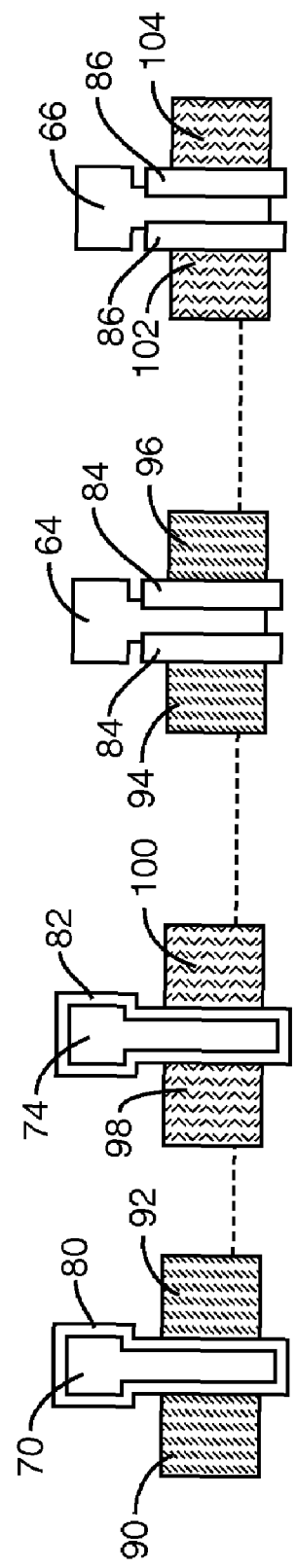

The n-type source region 98 and n-type drain region 100 for the n-channel MOSFET device, and the n-type source region 102 and n-type drain region 104 for the n-channel MESFET device, are formed as shown in the cross-sectional view of FIG. 3i. The n-type source and drain regions 98-104 for the MOSFET and MESFET devices are heavily doped in a single implant step. The implant may be phosphorous or arsenic at an energy of about 50 keV to a dose of about $10^{15}$ per $cm^2$. FIG. 3j shows a top view of the source and drain regions 98-104 for the n-channel MOSFET and n-channel MESFET devices.

In the source and drain implantation processing steps, a photoresist is spun on the surface of the wafer and patterned to open windows above the active regions of the p-type source and drain regions that are to be heavily doped with boron. In the case of the p-channel MOSFETs, the window is slightly larger than the n-well active region 60. The channel is masked from the dopants by the gate structure in a self-aligned manner. For the p-channel MESFET, the p-well region where the Schottky gate is formed, including the regions bounded to the left and right of the patterned salicide block oxide layer 84, should not be heavily doped. Accordingly, the source and drain implants for the p-channel MESFET will involve two openings in the photoresist, one for the source and one for the drain. The openings for the source and drain implants to the MESFET should overlap the patterned salicide block oxide by a distance corresponding to one design rule 1λ. Although the salicide-block oxide should prevent the implanted ions from reaching the silicon, the overlap will accommodate variations in the alignment.

The source and drain regions of the n-channel MOSFET and n-channel MESFET are heavily doped in a second implantation. In the case of the n-channel MOSFETs, the window is slightly larger than the p-well active region 62. The channel is masked from the dopants by the gate structure in a self-aligned manner. In the case of the n-channel MESFET the windows are opened in a photoresist layer above the source and drain regions of the n-channel MESFET, aligned to and overlapping the silicide block oxide regions 86 by one design rule 1λ. After completion of the implants, the wafer is annealed to activate the dopants at a temperature of 850° C. for 15 minutes. Any dopants extending under the oxide spacers 80 and 82 and the patterned silicide block are a result of the implant straggle and subsequent diffusion.

Figure 3K:
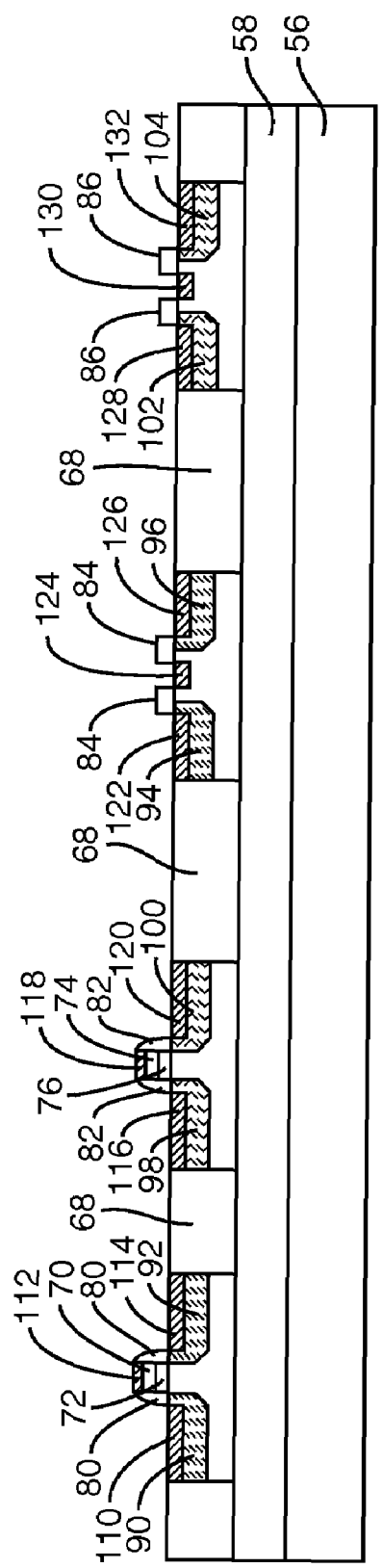
Figure 3L:
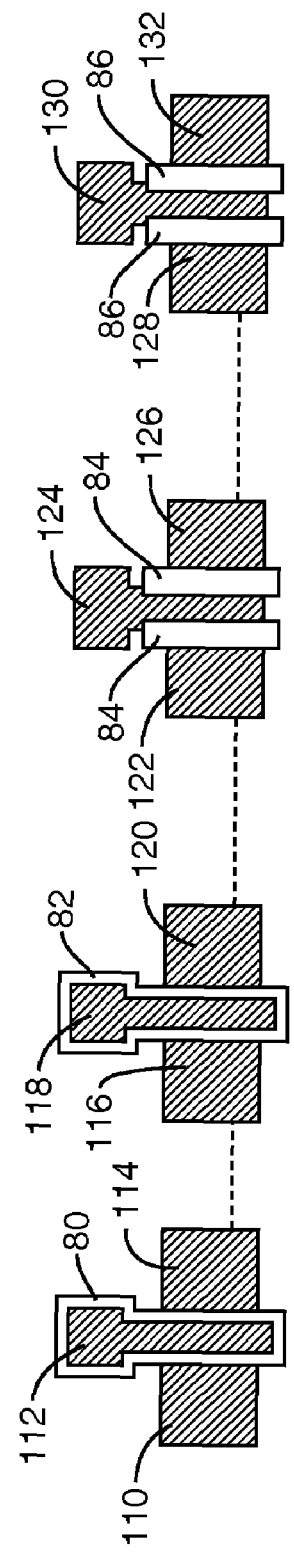

In the subsequent silicidation steps, a metal such as titanium or cobalt is deposited over the entire surface of the wafer by sputter coating. The wafer is then annealed in an inert gas such as nitrogen for a short time, typically 60 seconds, and at a temperature high enough to form the metal $TiSi_2$ or $CoSi_2$ silicide at 850° C. The metal forms the silicide where it is in contact with silicon. After the silicidation anneal, the unreacted metal above the isolation oxide and above the patterned silicide-block oxide can be removed by wet chemical etching in a dilute acid. After the unreacted metal is removed the remaining silicide acts as a low resistance contact to the source and drain regions, as a low resistance contact to the gate structure of the MOSFETs, and as a Schottky gate to the MESFETs, as shown in the cross-sectional view of FIG. 3k and the top view of FIG. 3l. For the MOSFET devices, silicide contact 110 connects to source region 90 of the p-channel MOSFET; silicide contact 112 connects to gate region 70 of the p-channel MOSFET; silicide contact 114 connects to drain region 92 of the p-channel MOSFET; silicide contact 116 connects to source region 98 of the n-channel MOSFET; silicide contact 118 connects to gate region 74 of the n-channel MOSFET; and silicide contact 120 connects to drain region 100 of the n-channel MOSFET. For the MESFET devices, silicide contact 122 connects to source region 94 of the p-channel MESFET; silicide contact 124 connects to the channel of the p-channel MESFET to form the Schottky gate; silicide contact 126 connects to drain region 96 of the p-channel MESFET; silicide contact 128 connects to source region 102 of the n-channel MESFET; silicide contact 130 connects to the channel of the n-channel MESFET to form the Schottky gate; and silicide contact 132 connects to drain region 104 of the n-channel MESFET.

Figure 3M:
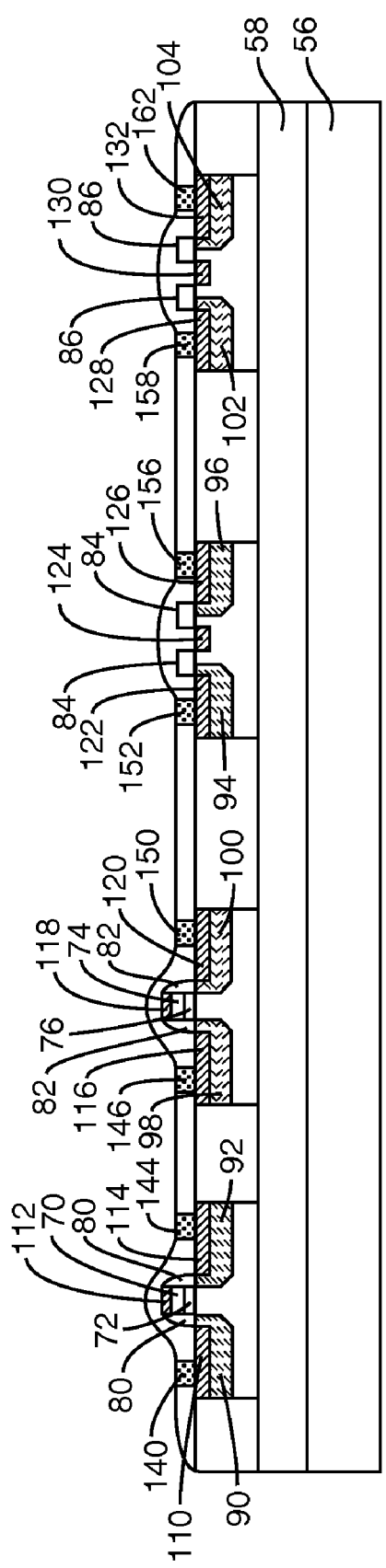

The final steps involve making electrical contact to the MOSFET and MESFET devices. In one embodiment, a borophospho-silicate glass can be deposited over the entire wafer. Openings in the glass, known as vias, are then patterned and etched down to the source, drain and gate silicide contacts. The vias are filled with metal plugs as shown in the cross-sectional view of FIG. 3m and top view of FIG. 3n. For the MOSFET devices, metal plug 140 connects to silicide contact 110; metal plug 142 connects to silicide contact 112; metal plug 144 connects to silicide contact 114; metal plug 146 connects to silicide contact 116; metal plug 148 connects to silicide contact 118; and metal plug 150 connects to silicide contact 120. For the MESFET devices, metal plug 152 connects to silicide contact 122; metal plug 154 connects to silicide contact 124; metal plug 156 connects to silicide contact 126; metal plug 158 connects to silicide contact 128; metal plug 160 connects to silicide contact 130; and metal plug 162 connects to silicide contact 132. Finally, the transistors can be wired together using a number of different metal layer interconnects according to the intended circuit structure and function.

Figure 3N:
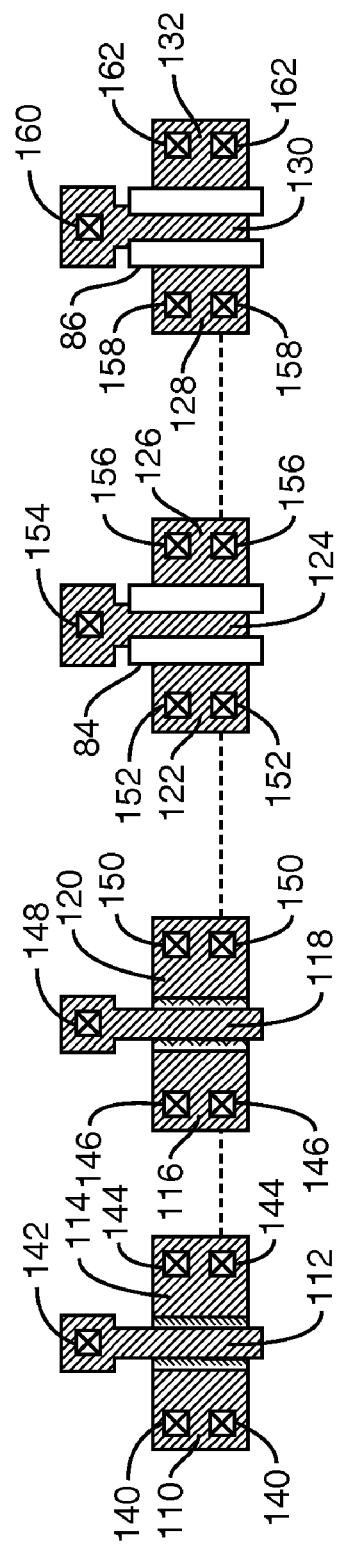
Figure 4A:
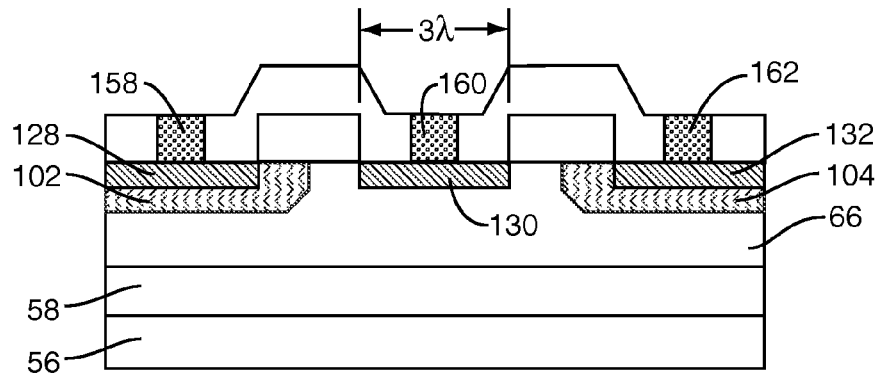
FIGS. 4a-4f illustrate cross-sectional and top views of forming interconnects to the MESFETs.
Figure 4B:
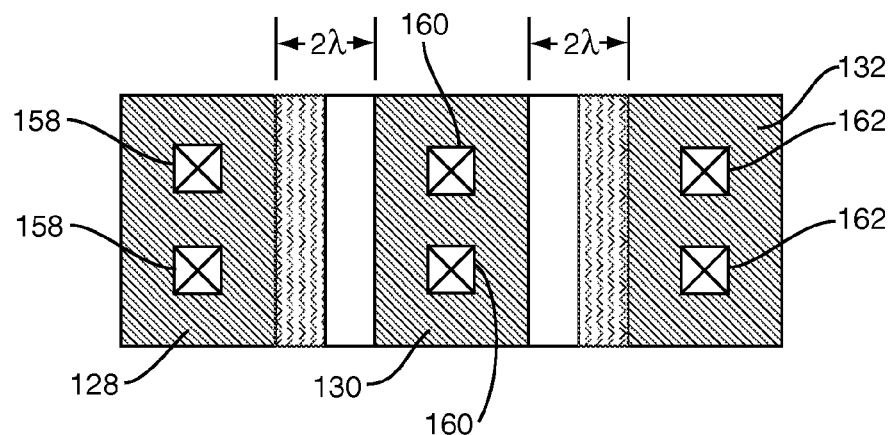

The T-gate extension of the n-channel and p-channel MESFETs shown in FIGS. 3a-3n gives a shorter gate length for a given set of design rules that specify the via opening size and distance from via to mesa edge, silicide-block oxide etc. If minimum gate lengths are not required other geometries for contacting the MESFET gate can be considered as shown in the cross-sectional view of FIG. 4a, wherein the via contact holes and metal plugs are placed directly onto and above the silicide gate active region. Because of the non-planar nature of the glass passivation layer the via hole has to be at least one design rule 1λ away from the edge of the patterned silicide-block region. If significantly closer than one design rule 1λ the via hole will overlap the thicker glass region that forms at the edge of the patterned silicide-block, which may be too thick to remove and may be difficult to clear the via hole during the etch step. For this geometry the minimum gate length will be of order three times larger than the design rule, i.e., 3λ. FIG. 4b illustrates a top view of the MESFET metal connect structure with 3λ spacing.

Figure 4C:
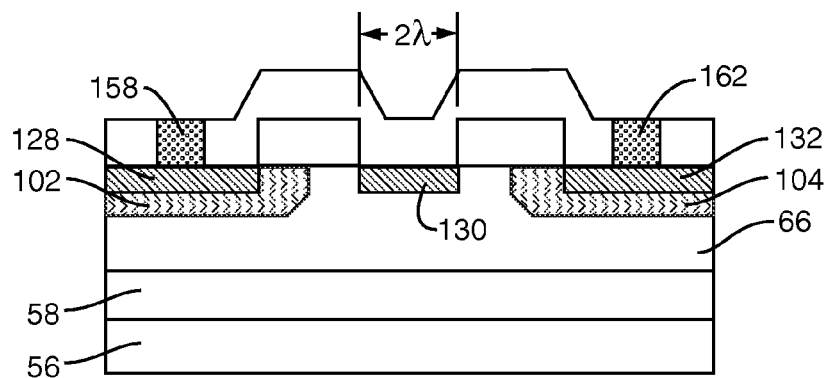
Figure 4D:
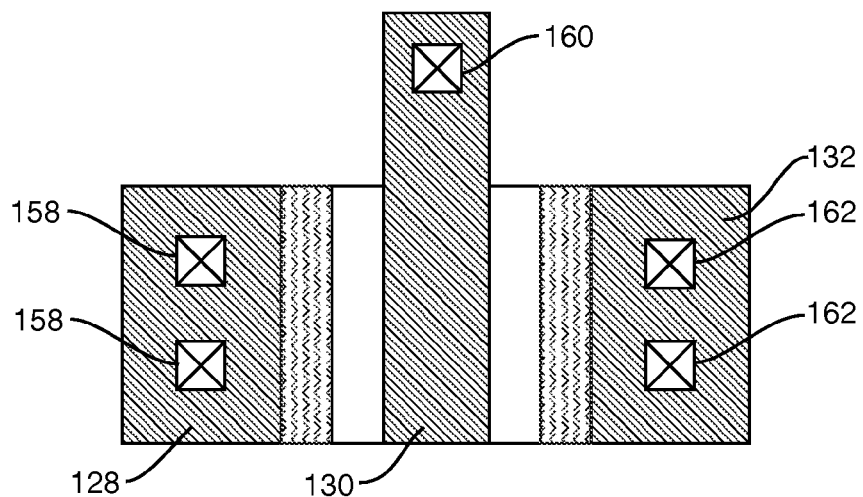

If the active region of the transistor has an extension as shown in the cross-sectional view of FIG. 4c, the via hole and contact to the silicide Schottky gate can be placed outside of the conducting channel formed between the source and drain of the MESFET. The via hole can be placed one design rule 1λ away from the edge of the patterned silicide-block, but in a direction vertically offset from the channel. The via hole still needs to be surrounded with silicide region by a design rule 1λ to allow for any alignment offsets that may occur. But now the length of the silicide Schottky gate can be reduced to 2λ. FIG. 4d illustrates a top view of the MESFET metal connect structure with 2λ spacing.

Figure 4E:
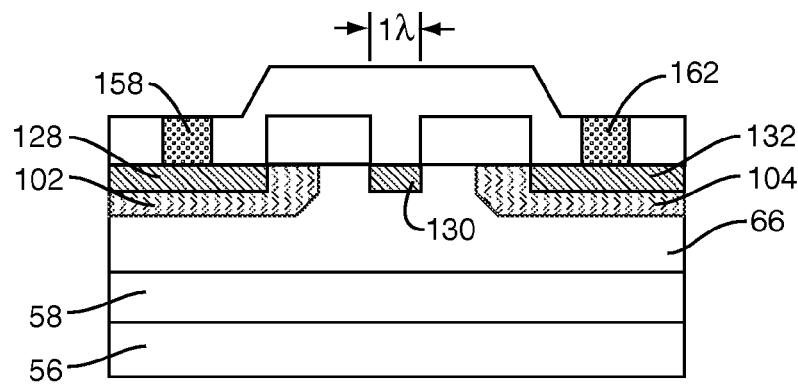
Figure 4F:
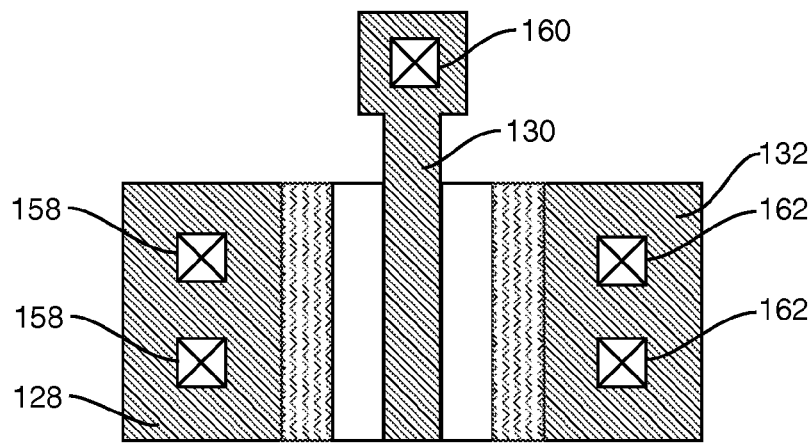

Further reduction in gate length can be achieved if the active region extension can be formed in the shape of a "T" as indicated in the cross-sectional view of FIG. 4e. The contact to the Schottky gate is made at the head of the "T"-shaped extension. The head of the extension is approximately square-shaped with sides of 3λ, such that the contact via hole is surrounded by salicide active region one design rule 1λ wide if the via hole is properly aligned. By using a "T"-shaped extension in this way, the contact via hole will still make contact to the metal silicide even if there is a large offset in the alignment. At the same time it allows the length of the Schottky gate, above the active channel where the drain current flows, to be reduced to a minimum size of one design rule 1λ as shown in FIG. 4e. FIG. 4f illustrates a top view of the MESFET metal connect structure with 1λ spacing.

The method described above for the fabrication of SOI MESFETs can be adapted to make MESFETs with a high voltage capability. When a high voltage is applied to the drain of a transistor, most of the electric field is dropped in the region under the gate that is closest to the drain. For sufficiently high drain voltages, the drain electric field can exceed certain breakdown fields and the device will fail catastrophically. Field effect transistors that require a high drain voltage capability often make use of a drift field region between the gate and the drain contact. The drift field region is in general longer than the typical distance between the gate and the drain and for a given drain voltage the electric field will be reduced.

Figure 5A:
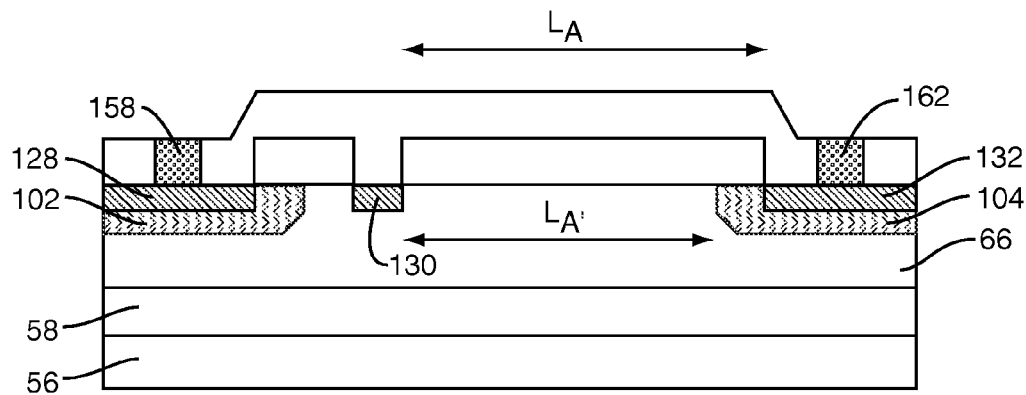
FIGS. 5a-5b illustrate an extended drift region for the MESFET.
Figure 5B:
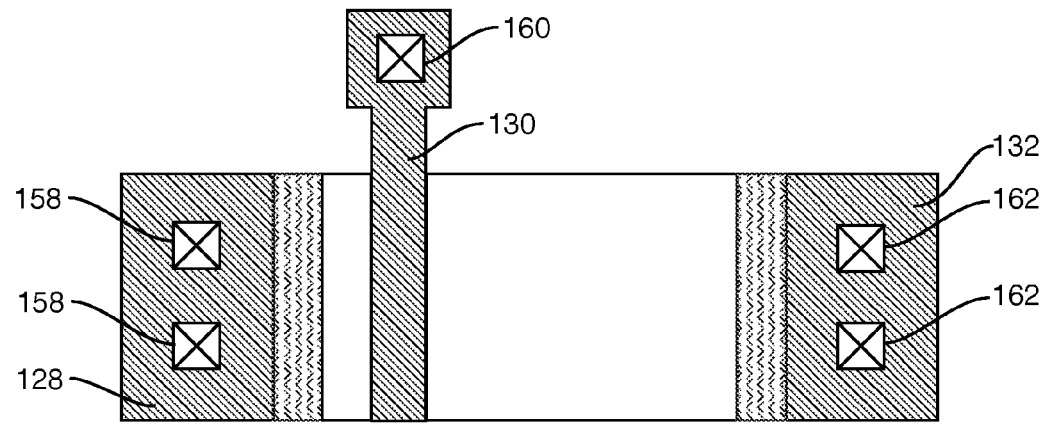

A drift field region can be added to the SOI MESFET described above. In FIGS. 4a-4f, the patterned silicide block is shown with a minimum dimension allowed by the design rules. In FIGS. 5a and 5b, the salicide block near the drain of the MESFET is shown with a longer dimension $L_A$. The length of the silicide block at the drain defines the length of the drift field region $L_A'$, which is reduced somewhat from $L_A$ due to the lateral extension of the drain implant and, to some extent, by the lateral extension of the gate silicide. A drift field region of arbitrary length can be defined, with larger $L_A'$ able to tolerate higher drain voltages.

Figure 6:
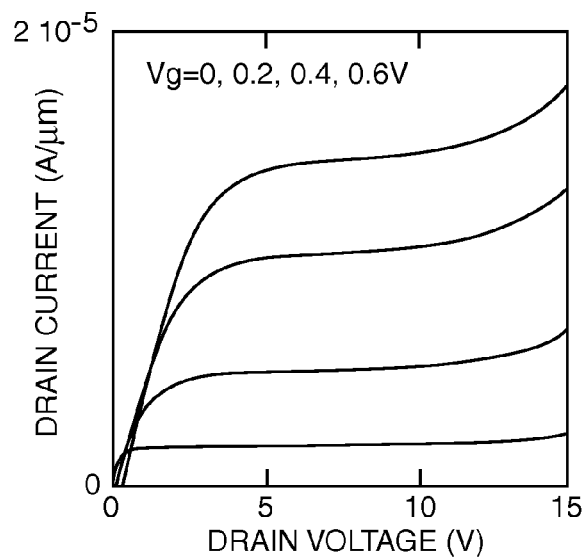
FIG. 6 is a plot of voltage versus current of the extended drift region MESFET.

The graph in FIG. 6 shows measured data from an exemplary SOI MESFET. The drawn gate length was 0.8 μm and $L_A$=0.6 μm. The MESFET demonstrates good output saturation up to $V_{DS}$=10 V, and with evidence of hot carrier effects from $V_{DS}$=10-15 V at the higher gate voltages. The I-V curves in FIG. 6 follow the same traces as the drain voltage is swept up to 15 V and then back down to zero repeatedly, with no signs of catastrophic failure that would lead to very different I-V curves after ramping to high $V_{DS}$.

Figure 7A:
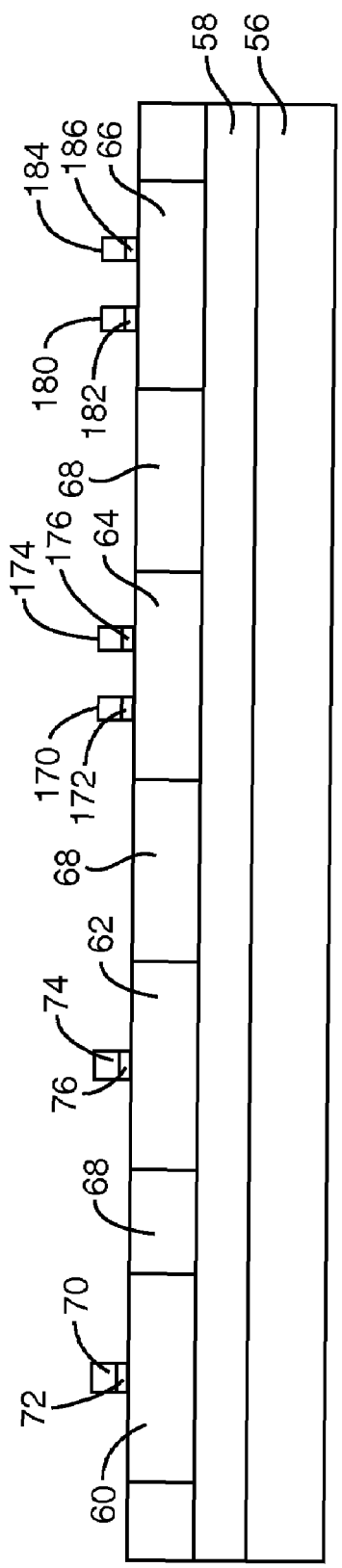
FIGS. 7a-7b illustrate a process of patterning poly-silicon separators above the active regions of the MESFETs.
Figure 7B:
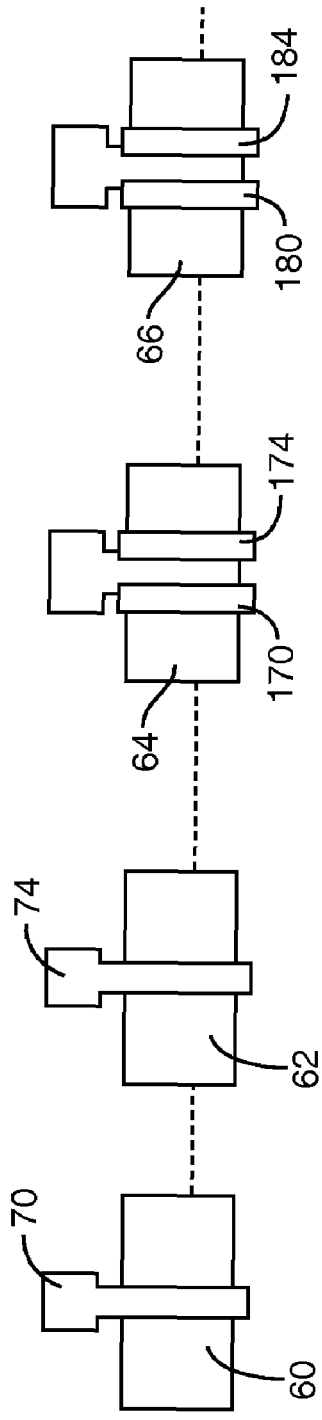
Figure 8A:
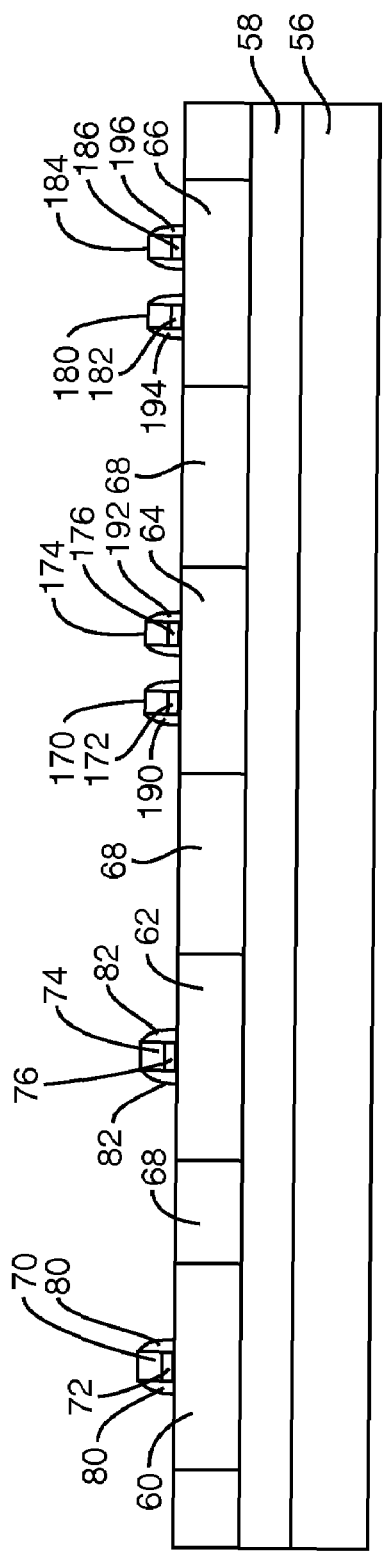
FIGS. 8a-8b illustrate a process of forming spacer sidewalls along the edges of the poly-silicon separators above the active regions of the MESFETs.
Figure 8B:
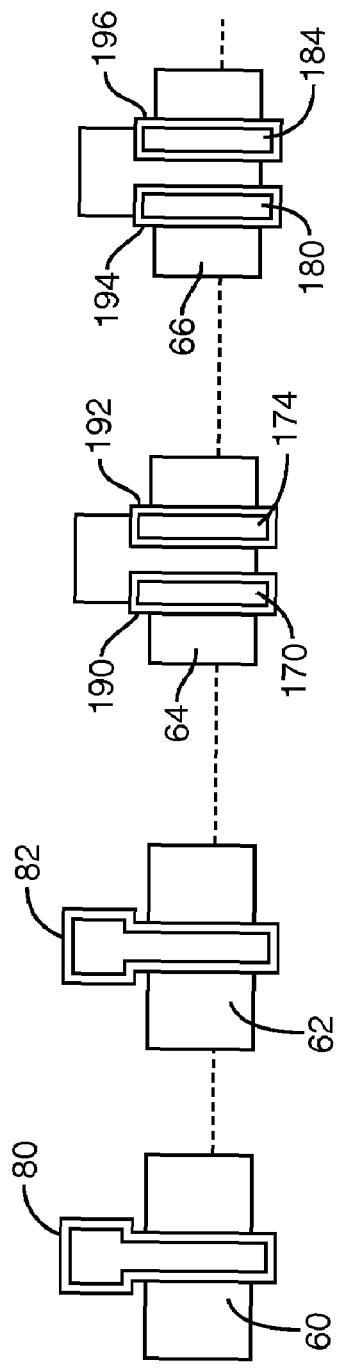
Figure 9A:
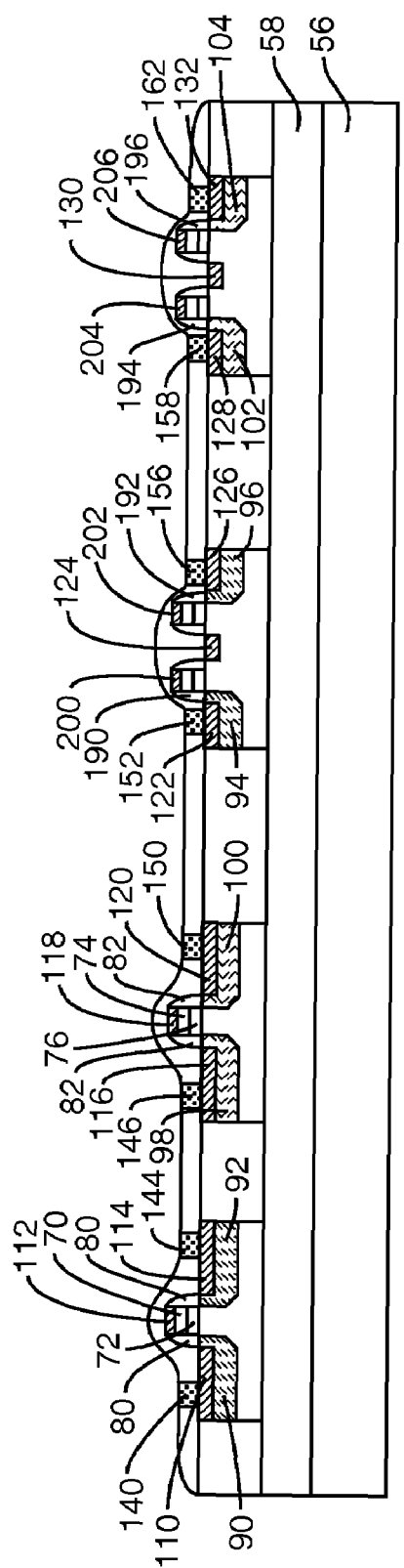
FIGS. 9a-9b illustrate a process of forming contacts to the poly-silicon separators above the active regions of the MESFETs.
Figure 9B:
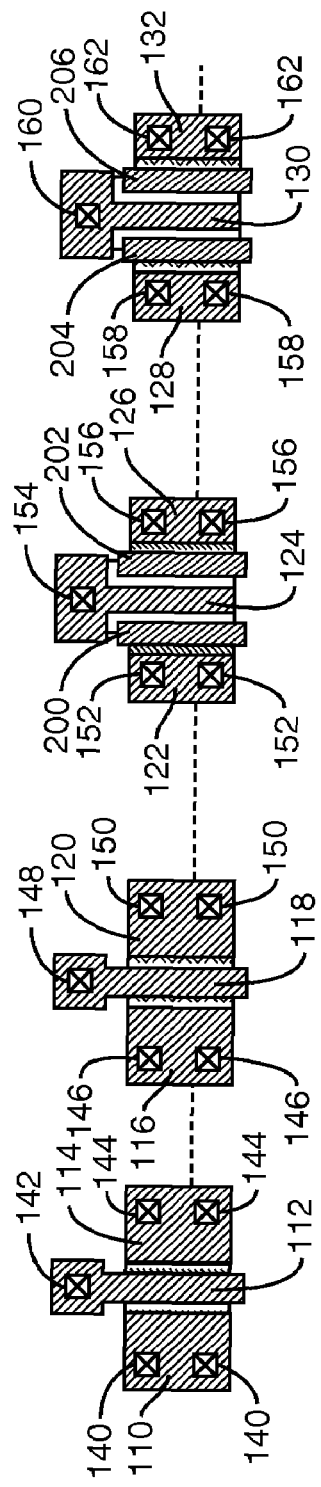

An alternative method to separate the silicide Schottky gate from the silicide source and drain contacts is shown in FIGS. 7-9. A poly-silicon step can also be used to separate the silicide Schottky gate from the silicide contacts to the source and drain regions and form separated silicide regions. The process flow would be the same up to and including the active regions as shown in FIGS. 3a-3b. The subsequent oxidation and poly-silicon deposition to form the gate structure shown in FIGS. 3c-3d would be modified as shown in FIGS. 7a-7b. Poly-silicon regions or separators 170, 174, 180, and 184 overlying oxide layers 172, 176, 182, and 186, respectively, are patterned above the active region of the n-channel and p-channel MESFETs. The poly-silicon separators 170-184 serve a similar purpose as the salicide-block oxide layers 84 and 86 shown in FIGS. 3e-3f. After the poly-silicon gates and poly-silicon separators are formed, a plasma enhanced chemical vapor deposition (PECVD) oxide is deposited over the wafer and subsequently etched away to form spacers sidewalls 190, 192, 194, and 196 along the edges of the poly-silicon as shown in FIGS. 8a-8b. The rest of the process flow would continue as shown in FIGS. 3g-3l. The final n-channel and p-channel MESFET devices include MOS regions that separate the silicide Schottky gate from the silicide source and drain regions as shown in FIGS. 9a-9b. Silicide contacts 200, 202, 204, and 206 are formed on the poly-silicon separators 170, 174, 180, and 184, respectively. The poly-silicon separators are left floating as shown. Other schemes can provide contacts to the poly-silicon regions above the MESFET channel, allowing them to have a bias voltage or signal applied.

While one or more embodiments of the present invention have been illustrated in detail, the skilled artisan will appreciate that modifications and adaptations to those embodiments may be made without departing from the scope of the present invention as set forth in the following claims.

What is claimed is:

1. A method of forming a MESFET, comprising:
   forming a substrate;
   forming an active layer over the substrate comprising a lightly doped well region having a body and an extension extending from the body in the active layer, wherein a cross-section of the lightly-doped well region taken along a plane extending through the extension and substantially parallel to a surface of the MESFET is substantially T-shaped;
   forming a heavily doped source region in the body;
   forming a heavily doped drain region in the body and separate from the source region wherein a gate region is provided between the source region and the drain region and contiguous with the extension;
   forming a silicide source contact in the source region;
   forming a silicide drain contact in the drain region; and
   forming a silicide gate contact in the gate region and the extension.

2. The method of claim 1, further comprising forming a first separator at least in part over the body.

3. The method of claim 2, further comprising forming a second separator at least in part over the body.

4. The method of claim 3, wherein the first separator inhibits suicide formation between the silicide gate contact and the suicide source contact and the second separator inhibits silicide formation between the silicide gate contact and the silicide drain contact.

5. The method of claim 1, further comprising forming a first metal plug in the extension.

6. The method of claim 5, further comprising forming a second metal plug in the silicide source contact, and a third metal plug in the suicide drain contact.

7. The method of claim 1, wherein a portion of the active layer that surrounds the body and the extension comprises an insulation region.

* * * * *